United States Patent [19]

Corman et al.

[11] 4,345,267

[45] Aug. 17, 1982

[54] ACTIVE DEVICE SUBSTRATE CONNECTOR HAVING A HEAT SINK

[75] Inventors: Ned E. Corman, Harrisburg; Steven J. Kandybowski, Tower City; William S. Scheingold, Palmyra; Frank C. Youngfleish, Harrisburg, all of Pa.

[73] Assignee: AMP Incorporated, Harrisburg, Pa.

[21] Appl. No.: 136,017

[22] Filed: Mar. 31, 1980

[51] Int. Cl.³ .................... H01L 23/02; H01L 23/42; H01L 23/44

[52] U.S. Cl. .................................. 357/81; 357/79; 361/382; 165/80 A

[58] Field of Search ............... 357/79, 81; 165/80; 361/382

[56] References Cited

U.S. PATENT DOCUMENTS

| | | | |
|---|---|---|---|
| 3,414,775 | 2/1968 | Melan et al. | 357/81 |
| 3,548,927 | 12/1970 | Spurlino | 357/81 |
| 3,670,215 | 6/1972 | Wilkens et al. | 357/81 |
| 3,732,733 | 3/1968 | Callender | 357/81 |
| 3,836,825 | 9/1974 | Wall et al. | 357/81 |
| 4,000,509 | 12/1976 | Jarvela | 357/81 |
| 4,004,195 | 1/1977 | Harayda et al. | 357/81 |
| 4,093,371 | 6/1978 | Chu et al. | 357/81 |
| 4,246,597 | 1/1981 | Cole et al. | 357/81 |

FOREIGN PATENT DOCUMENTS

| | | | |
|---|---|---|---|
| 54-302 | 5/1979 | Japan | 357/81 |
| 1316086 | 9/1973 | United Kingdom | 357/81 |
| 1334173 | 10/1973 | United Kingdom | 357/81 |

OTHER PUBLICATIONS

Heat Dissipator Assemblies; IBM Publication vol. 8, No. 10, Mar. 1966; by Melan et al., pp. 1460–1461.
Semiconductor package with improved Cooling; by Dorler, IBM Technical Bulletin, vol. 20, No. 9, Feb. 1978, pp. 3452–3453.

Primary Examiner—Andrew J. James
Attorney, Agent, or Firm—Allan B. Osborne

[57] ABSTRACT

The present invention is to a heat sink device designed to conduct heat away from an active device substrate housed in a connector of the type having a hinged cover with spring elements thereon. More particularly the preferred embodiment includes a base member, in intimate contact with the substrate, positioned on the inside of the cover, and a heat exchanger attached to the base and extending above the cover.

1 Claim, 7 Drawing Figures

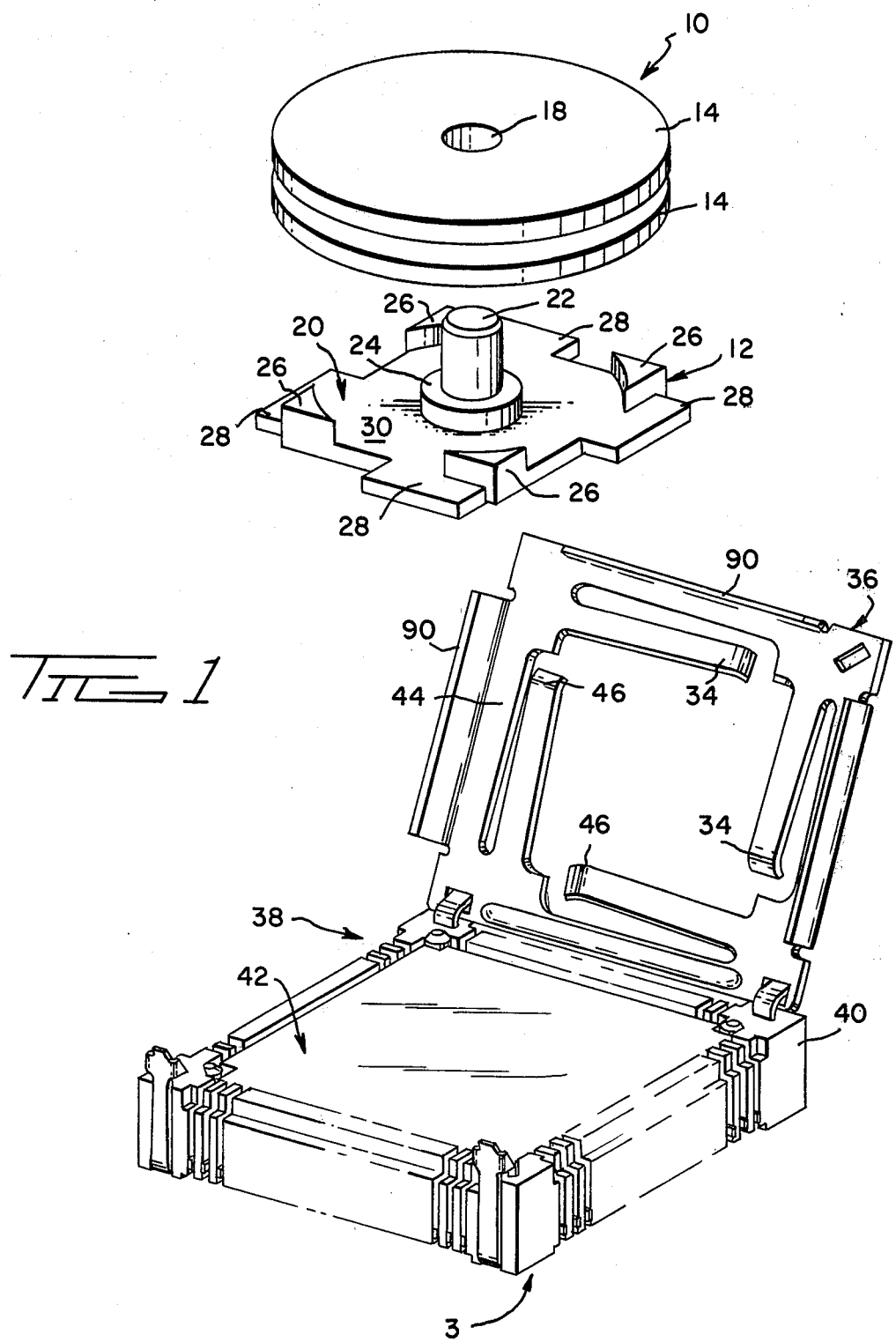

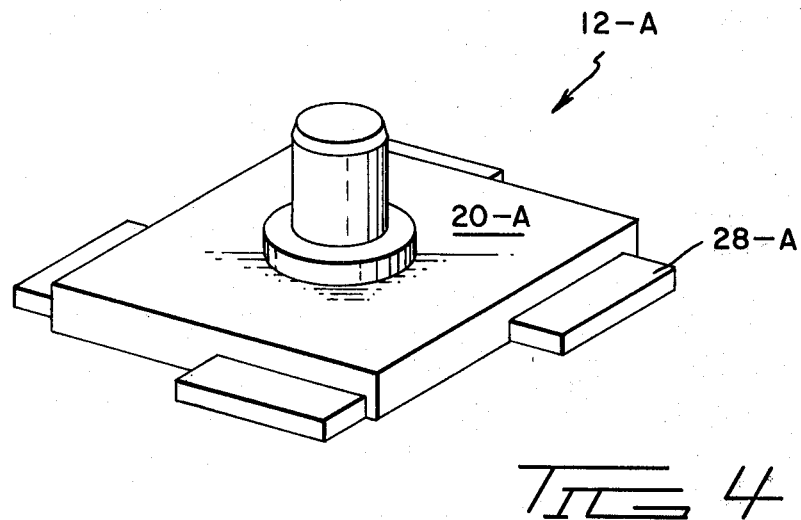
_FIG. 4_
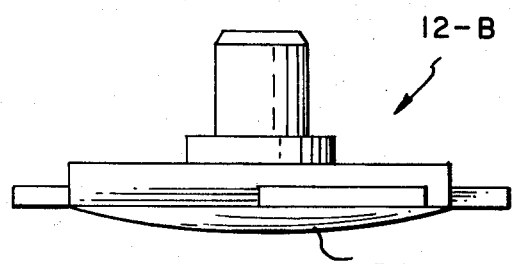
_FIG. 5_

ACTIVE DEVICE SUBSTRATE CONNECTOR HAVING A HEAT SINK

BACKGROUND OF THE INVENTION

1. Field of the Invention

This invention is in the field of dissipating heat from active device substrates; i.e., integrated circuit chips embedded in a chip carrier. The heat dissipation is by air flow.

2. The Prior Art

Many patents have issued which teach heat dissipation from integrated circuit chips, generically referred to herein as active device substrates. One such patent is U.S. Pat. No. 4,000,509. The patentee teaches a heat sink cover having cooling fins on one side and a package-receiving recess on the other side. Heat dissipation is enhanced by providing a thermal grease interface and by pressure being applied to the interface.

SUMMARY OF THE PRESENT INVENTION

The present invention includes a heat sink device having a base plate which abutts the active device substrate beneath the cover on the substrate connector. A heat exchanger consisting of a plurality of fins or discs extend above the cover, being attached to the base plate by a post. Pressure forcing the base plate against the substrate is supplied by the spring fingers on the cover.

BRIEF DESCRIPTION OF THE ACCOMPANYING DRAWINGS

FIG. 1 is a perspective view of the two components of the heat sink constructed in accordance with the preferred embodiment of the present invention, and the connector with a cover adapted to receive the heat sink;

FIGS. 4 and 5 illustrate alternative forms of the base of the present invention;

DETAILED DESCRIPTION OF THE PREFERRED EMBODIMENT

The two components of the preferred embodiment of the present invention are the heat exchanger 10 and base 12.

Figure 3:
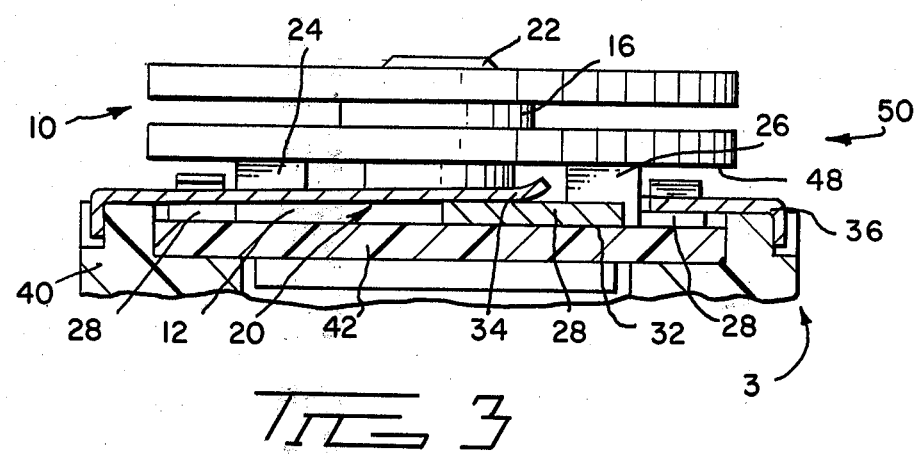
FIG. 3 is a cross-sectional view in elevation taken along lines 3—3 of FIG. 2.

The heat exchanger consists of any given number of cooling fins or discs 14 which, when more than one is provided, are connected together by any means. In the preferred embodiment the entire heat exchanger is milled or otherwise fabricated from one piece of thermally conductive material; e.g., aluminum. Material left between the discs provide the mechanical connection and thermal path. This connection, indicated by reference numeral 16 is centrally located as shown in FIG. 3.

A hole 18 extends vertically through the heat exchanger. As shown, it is centrally located.

The discs are spaced one from the other so that air can circulate through and contact all the available surface area of the discs. In this respect, the anticipated cooling air flow should be considered in determining both the surface area of the discs and the spaces therebetween. The ability of a heat sink device to function adequately with a low air flow minimizes the noise associated with a forced air cooling system. Other considerations involving cooling discs designs include the vertical and horizontal space available for the discs and of course the most important factor is the amount of heat which must be dissipated.

Base 12 is milled or otherwise fabricated from a single piece of material, preferably the same as used in making heat exchanger 10. The several structural features on the base includes plate 20, post 22, collar 24, upstanding platforms 26 and extensions 28. All of these features are located on upper surface of plate 20. The under surface 32 (FIG. 3) of the plate is smooth.

Heat exchanger 10 is attached to base 12 by pressing the post 22 through hole 18. The dimensions of both are such so as to provide a tight interference fit. The collar 24 and platforms 26 stop the exchanger at a pre-determined distance above plate 20. They, along with post 22 transfer heat from the plate to the discs.

Extensions 28 are spaced symmetrically about the periphery of plate 20. These extensions provide pressure points for spring fingers 34 located on cover 36 of the ADS connector 38.

ADS connector 3 includes housing 40 into which an active device substrate 42 is placed. As is known in the art, the housing contains contact members (not shown) which electrically connect the substrate to conductive traces on a PCB (not shown).

In assembling the heat sink device, base 12 is first placed against inside surface 44 (FIG. 1) of cover 36 with the tips 46 of spring fingers 34 in alignment with extensions 28 on base plate 20. The heat exchanger 10 is then pushed onto post 22 until the under surface 48 of the lowest-most disc abuts collar 24 and platforms 26.

Figure 2:
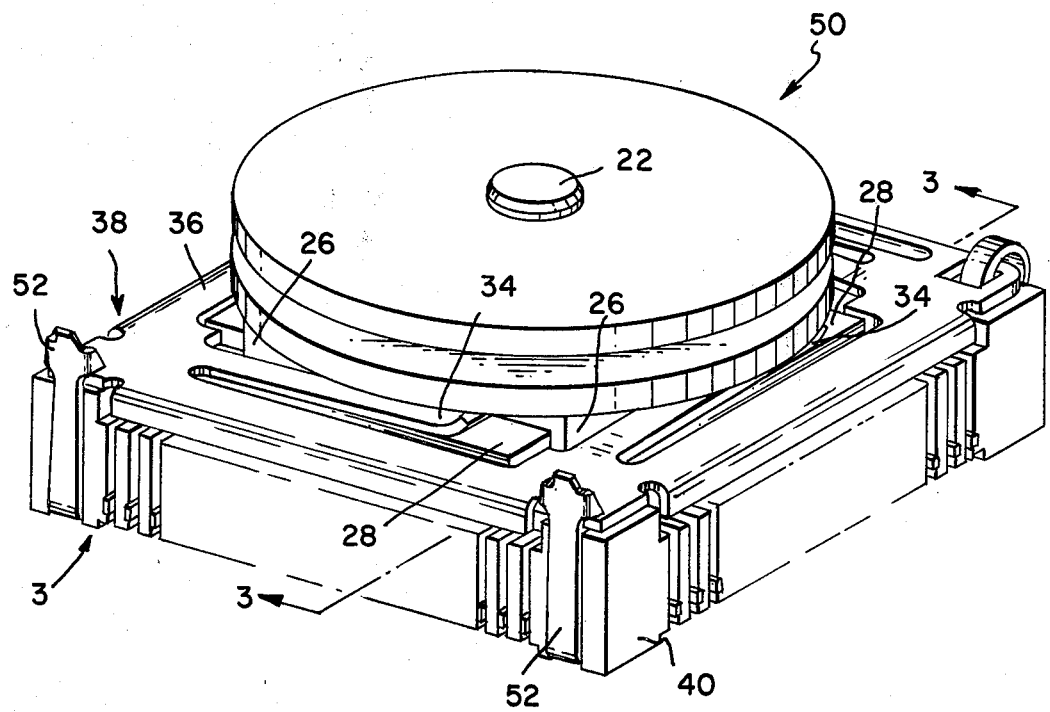
FIG. 2 shows the assembled heat sink of FIG. 1 mounted on the connector.

FIGS. 2 and 3 show heat sink device 50, of the present invention, assembled onto cover 36. The drawing in FIG. 3 shows, in cross-section, base plate 20 abutting substrate 42. Pressure is being applied by spring fingers 34 bearing against extensions 28 by virtue of cover 36 being latched to housing 40 as shown in FIG. 2. The latches are indicated in that figure by reference numeral 52. The spring fingers are capable of generating substantial normal force at the base plate-substrate interface. A thermally conductive gasket (not shown) may also be inserted at this interface if desired.

Each extension occupies less than half the length of an edge. The space is required so that the spring finger not engaging the extension has room to flex and thus operate properly.

FIGS. 4 and 5 disclose alternate forms base 12 can take. Base 12-A shown in FIG. 4 omits platforms 26. Extensions 28-A are about half the thickness of plate 20-A.

Base 12-B shown in FIG. 5 discloses a contoured under surface 54. It has been discovered that during the manufacturing of the active device substrates, the surface against which the under surface of the base plate abutts sometimes becomes bowed or concave. Accordingly, in order to achieve the maximum physical contact between the two surfaces, the under surface of the base plate may be contoured, either in a convex shape or other conformable shape. The contoured under surface may of course be provided on base 12 as well as base 12-A shown.

DESCRIPTION OF AN ALTERNATIVE EMBODIMENT

Figure 6:
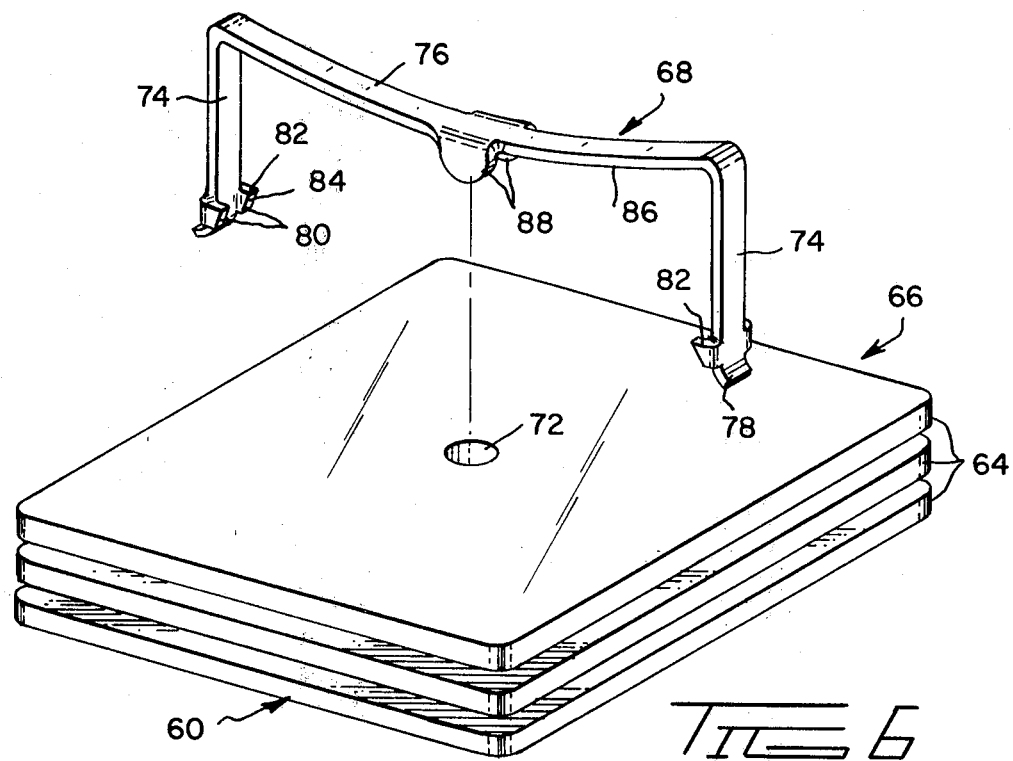
FIG. 6 shows in perspective an alternative embodiment of a heat sink.
Figure 7:
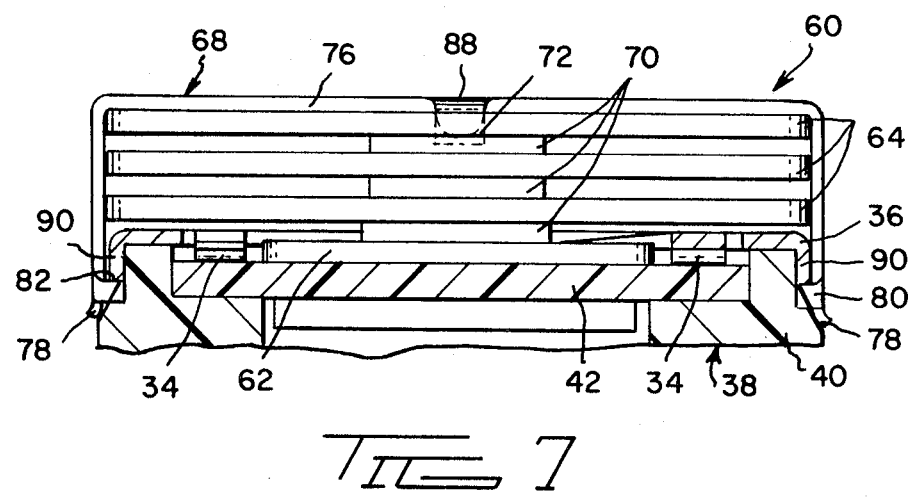
FIG. 7 is a cross-sectional view of the heat sink of FIG. 6 mounted on a connector of FIG. 1.

FIGS. 6 and 7 illustrate an alternative embodiment which employes a separate spring member to furnish pressure between the heat sink base plate and the active device substrate.

The heat sink device 60 of the alternative embodiment consists of a base plate 62 (FIG. 7), a plurality of cooling fins or discs 64 comprising the heat exchanger 66 and a spring member 68.

Contrary to the preferred embodiment (reference numeral 50, FIGS. 1-3) base plate 62 and heat exchanger 66 are preferably milled or otherwise fabricated from a single piece of material, preferably aluminum; i.e., heat sink device 60 does not need additional assembly subsequent to its preferred method of manufacture.

Other differences also exist in the structure itself. The base plate is smaller in surface area so that it can fit in the opening between spring fingers 34 on cover 36. Discs 64 are square and each are as large in surface area as the cover. Connecting sections 70 between the discs and base plate is similar in structure and function as connecting section 18 in device 50.

The upper-most disc has an opening 72 centrally located on the top surface.

Spring member 68 is U-shaped, having legs 74 joined by bight 76. Each leg has its free end 78 curving outwardly; i.e., away from the spring member. Two inwardly projecting ears 80 are located on each leg just above the free end. Each ear has a shoulder 82 and a beveled edge 84. The ears provide means for latching heat sink device 60 onto ADS connector 38 in the manner to be discussed below.

Bight 76 has a concave-convex shape with the convex surface, indicated generally by reference numeral 86, facing the aforementioned ears 80. Two bosses, collectively referenced by numeral 88, extend downwardly towards the ears from each side of the bight mid-way between the two legs. The free edge of each boss is preferably rounded as shown.

Spring member 68 is made from a resilient material such as stainless steel.

After substrate 42 has been positioned in housing 40, cover 36 is latched to the housing (via latches 52 shown in FIG. 2). Spring fingers 34 bear directly against the substrate as shown in FIG. 7. Heat sink device 60 is placed on the connector with its base plate 62 resting against substrate 42 and the heat exchanger extending above cover 36. Device 60 is latched onto the connector by sliding spring member 68 down over the discs so that shoulders 82 (on ears 80) catch below flanges 90 located on each side of cover 36 (see FIG. 1). Bosses 88 have entered into opening 72 on top of the heat exchange to immobilize the spring member. The cross-sectional view in FIG. 7 illustrates the above-described latching. Note that the bight, reference numeral 76, has been placed in compression. This supplies pressure against substrate 42 to enhance heat conductivity.

A thermally conductive gasket may be inserted between base plate 62 and substrate 42 if desired.

It is to be understood that the forms of the invention shown and described herein are but preferred embodiments thereof and that various changes and modifications can be made therein without departing from the spirit or scope of the invention.

What is claimed is:

1. An active device substrate connector incorporating a heat sink, comprising:
   a. a housing having a central cavity into which an active device substrate may be positioned;
   b. a cover hingedly connected to one side of the housing for covering the substrate-receiving cavity and having a plurality of spring fingers spaced around a centrally positioned opening through the cover; and
   c. a heat sink of thermally conductive material comprising:
      i. a base plate removably positionable in between the inside of the cover when closed over the housing and a substrate which may be positioned in the cavity, said spring fingers on the cover bearing against the plate to retain it in the housing and to bias it against the substrate;
      ii. a heat-exchanger consisting of a plurality of vertically stacked discs; and
      iii. means for mechanically and thermally removably connecting the heat exchanger to the base plate through the cover opening.

* * * * *